US007009843B2

(12) United States Patent
Lee et al.

(10) Patent No.: US 7,009,843 B2
(45) Date of Patent: Mar. 7, 2006

(54) HEAT SINK CLIP WITH PRESSING POST

(75) Inventors: Hsieh Kun Lee, Tu-chen (TW); Wellint Xia, Shenzhen (CN); Toly Lee, Shenzhen (CN); Gen-Cai Wang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 231 days.

(21) Appl. No.: 10/627,785

(22) Filed: Jul. 25, 2003

(65) Prior Publication Data

US 2005/0024832 A1 Feb. 3, 2005

(30) Foreign Application Priority Data

Sep. 9, 2002 (TW) .............................. 91214019 U

(51) Int. Cl.
*H05K 7/20* (2006.01)

(52) U.S. Cl. ..................... 361/704; 361/710; 165/80.3; 165/185; 174/16.3; 257/707; 257/718

(58) Field of Classification Search ........ 361/702–712, 361/714–719, 767–770; 257/706–719, 721–727; 165/80.2, 80.3, 185; 174/15.1, 16.3; 24/453, 24/607, 458, 608; 411/525, 526, 512, 338, 411/339, 508–510; 248/271, 505, 510
See application file for complete search history.

(56) References Cited

U.S. PATENT DOCUMENTS

| | | | | |
|---|---|---|---|---|
| 5,932,925 | A * | 8/1999 | McIntyre | 257/719 |
| 6,058,014 | A * | 5/2000 | Choudhury et al. | 361/704 |
| 6,370,024 | B1 | 4/2002 | Lo | |
| 6,412,546 | B1 * | 7/2002 | Lin et al. | 165/80.3 |
| 6,462,945 | B1 * | 10/2002 | Sloan et al. | 361/687 |
| 6,462,951 | B1 * | 10/2002 | Letourneau | 361/704 |
| 6,466,445 | B1 | 10/2002 | Chen | |
| 6,724,632 | B1 * | 4/2004 | Lee et al. | 361/719 |
| 6,809,929 | B1 * | 10/2004 | Liu | 361/704 |

* cited by examiner

*Primary Examiner*—Michael Datskovskiy
(74) *Attorney, Agent, or Firm*—Wei Te Chung

(57) ABSTRACT

A heat sink clip (20) includes a main body, a post (26), and a spring (27). The main body includes a longitudinal portion (31), first and second locking arms (32, 24) extending downwardly from opposite ends of the longitudinal portion. The longitudinal portion defines a through aperture (36) in a middle thereof. Two hooks (38, 46) are respectively formed at free ends of the first and second locking arms for engagement with catches (52) of a socket (52). The post has a pressing portion at a bottom thereof for being fittingly received in a blind hole (16) of a heat sink (10). The post extends through the through aperture of the longitudinal portion. The resilient element is disposed around the post below the longitudinal portion.

20 Claims, 4 Drawing Sheets

HEAT SINK CLIP WITH PRESSING POST

BACKGROUND OF THE INVENTION

1. Field of the Invention

The present invention relates to securing of heat sinks to electronic packages; particularly to a heat sink clip capable of providing an adaptable compressing force applied to a heat sink for securely and readily retaining the heat sink to an electronic package, and a heat sink assembly employing such a heat sink clip.

2. Related Art

In order to reduce heat produced by high-speed computer Central Processing Units (CPUs) such as the Pentium IV produced by Intel(R) and the K8 produced by AMD(R), bigger and heavier heat sinks are becoming increasingly necessary. Strong resilient clips are often used to attach these heat sinks onto electronic packages.

An example of this kind of heat sink clip is disclosed in Taiwan patent publication No. 456586. The clip is usually integrally formed from a sheet of plastic or steel. The clip comprises a central pressing portion, and two resilient portions extending outwardly and upwardly from opposite sides of the pressing portion. Two locking portions depend from distal ends of the pressing portion, respectively. A locking hole is defined in each locking portion. In operation, the locking holes of the clip are lockably engaged with catches of a CPU socket. The pressing portion of the clip is deformably attached to a surface of a heat sink for securing the heat sink to a CPU mounted on the socket. Thus a resilient compressing force is applied to the heat sink by the clip. However, the resilient compressing force is invariable because it is provided only by the deformation of the clip. Therefore the clip lacks adaptability for use in various applications having different force requirements. Furthermore, the resilient compressing force tends to diminish over time due to fatigue.

BRIEF SUMMARY OF THE INVENTION

Accordingly, an object of the present invention is to provide a heat sink clip which is durable, and which is capable of providing an adaptable compressing force for securely attaching a heat sink to an electronic package in a variety of applications.

Another object of the present invention is to provide a heat sink assembly employing the above-described heat sink clip.

To achieve the above-mentioned objects, a heat sink clip of a preferred embodiment for attaching a heat sink to a CPU mounted on a socket comprises a main body, a post, and a spring. The main body comprises a longitudinal portion, and first and second locking arms extending downwardly from opposite ends of the longitudinal portion. The longitudinal portion defines a through aperture therein. Two hooks are respectively formed at free ends of first and second locking arms for engaging with catches of the socket. The post has a pressing portion at a bottom thereof for being fittingly received in a mating portion defined in the heat sink. The post extends through the through aperture of the longitudinal portion. The spring is arranged around the post and between the pressing portion and the longitudinal portion of the main body.

A heat sink assembly in accordance with the present invention comprises a heat sink having a mating portion defined therein, a support module having first engaging means, and a clip. The clip comprises a main body, a post, and a spring. The main body comprises a longitudinal portion, first and second locking arms extending downwardly from opposite ends of the longitudinal portion. The longitudinal portion defines a through aperture in a middle thereof. Two hooks are respectively formed at ends of the first and second locking arms to engage with the first engaging means of the support module. The post has a pressing portion at a bottom thereof for being fittingly received in the mating portion of the heat sink. The post extends through the through aperture of the longitudinal portion. The resilient element is disposed around the post below the longitudinal portion.

Other objects, advantages and novel features of the present invention will be drawn from the following detailed description of the present invention and claims together with the attached drawings, in which:

DESCRIPTION OF THE PREFERRED EMBODIMENT

Figure 1:
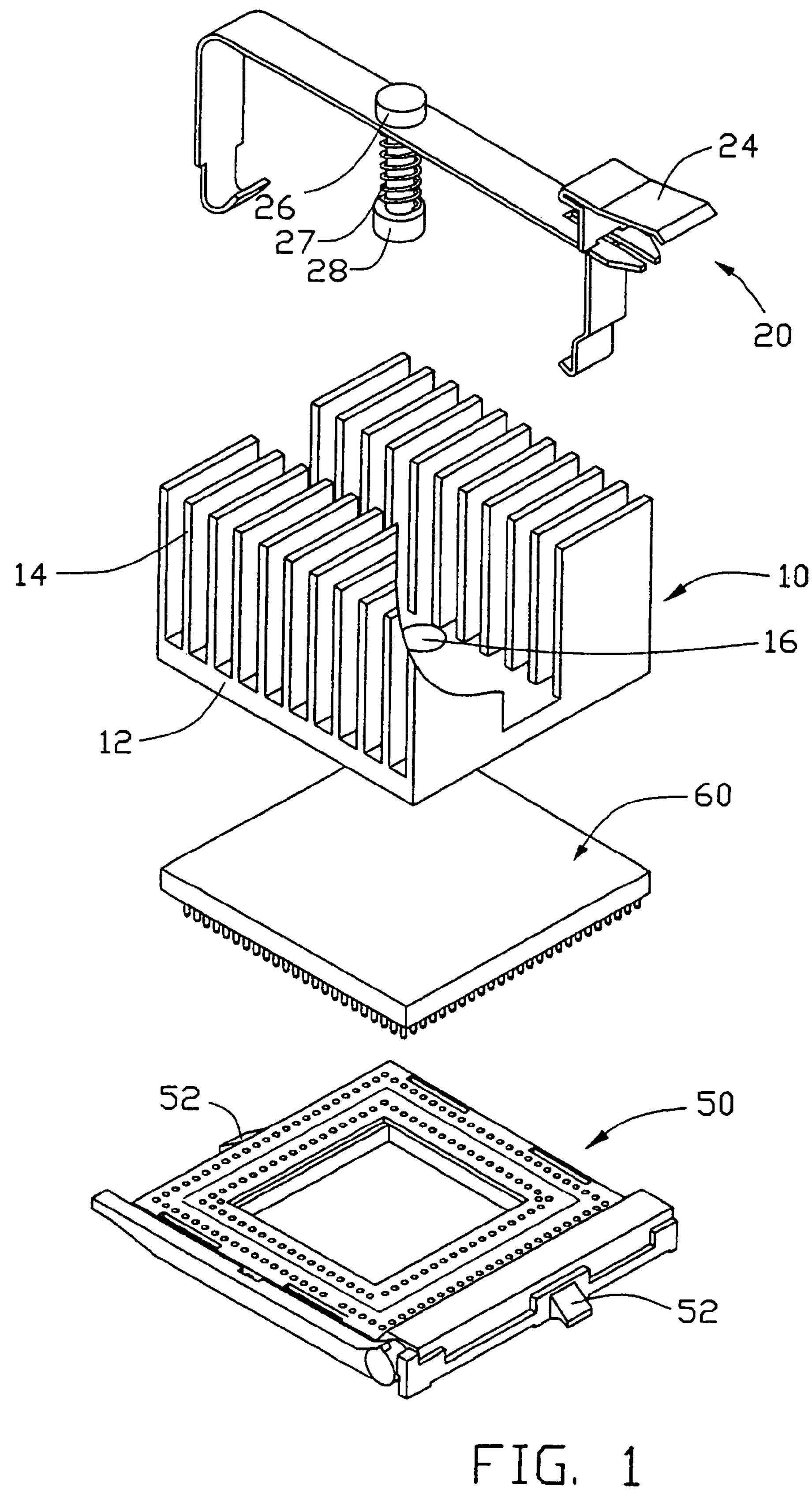
FIG. 1 is an exploded, isometric view of a heat sink assembly in accordance with the present invention together with a central processing unit (CPU), with part of a heat sink of the heat sink assembly cut away.

Referring to FIG. 1, a heat sink clip 20 in accordance with the preferred embodiment of the present invention is used to press a heat sink 10 onto a CPU 60 mounted on a socket 50. The heat sink clip 20 comprises a main body (not labeled), a post 26, and a spring 27.

The heat sink 10 comprises a base 12, and a plurality of fins 14 extending upwardly from the base 12. A channel (not labeled) is defined in a middle of the heat sink 10. A blind hole 16 is defined in a top surface (not labeled) of the base 12 in the channel. The socket 50 forms two catches 52 at opposite sides thereof respectively, corresponding to opposite ends of the channel of the heat sink 10.

Figure 2:
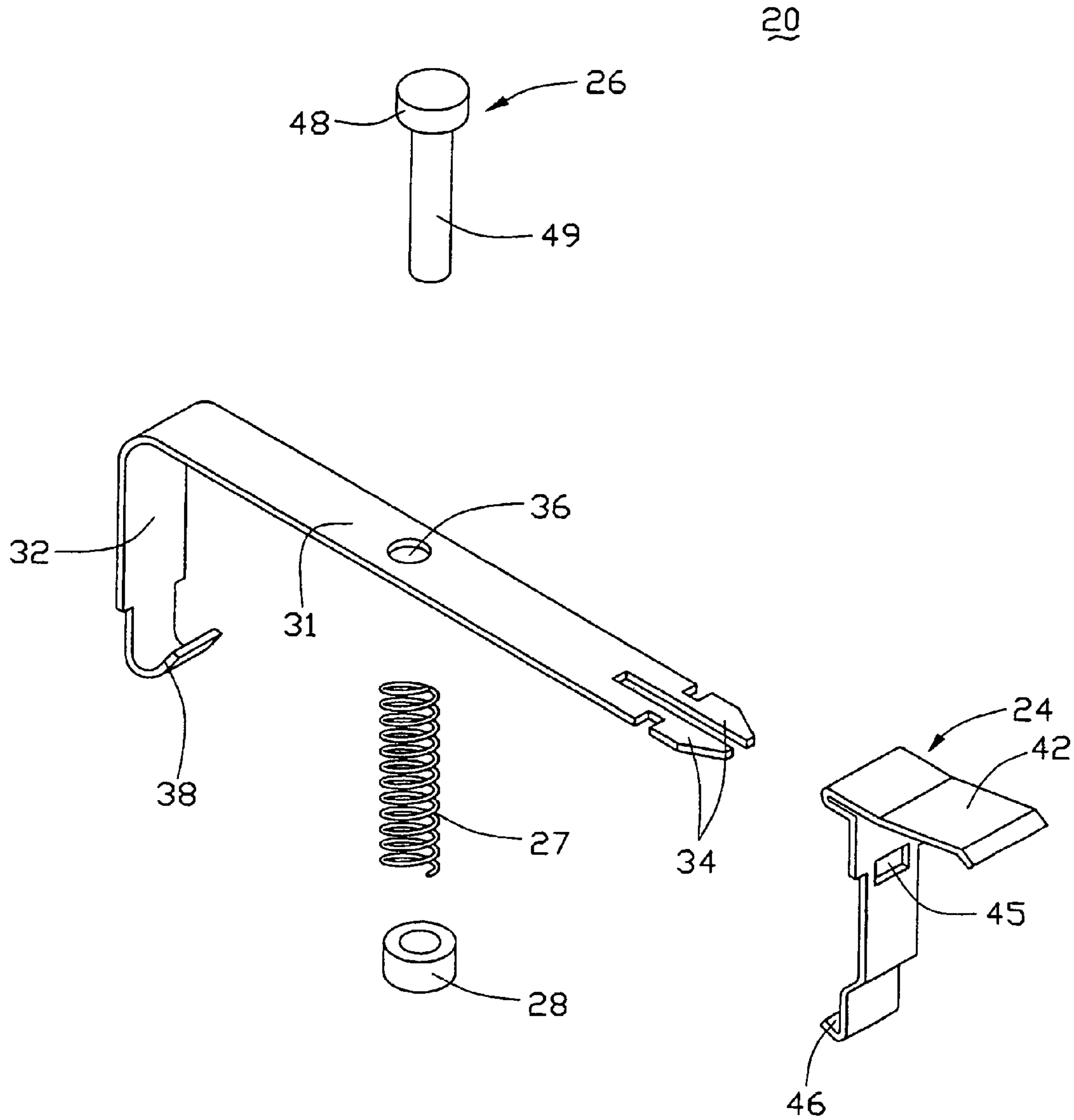
FIG. 2 is an exploded, isometric view of a heat sink clip of the heat sink assembly of FIG. 1.

Referring to FIG. 2, the main body of the clip 20 comprises a longitudinal portion 31, and a first locking arm 32 and a second locking arm 24. The first locking arm 32 integrally extends downwardly from a first end of the longitudinal portion 31. The second locking arm 24 is detachably fixed to and extends downwardly from an opposite second end of the longitudinal portion 31. A through aperture 36 is defined in a middle of the longitudinal portion 31. The second end of the longitudinal portion 31 is bifurcated, thereby forming two barbs 34. The second locking arm 24 comprises a handle 42 at an end thereof. A hole 45 is defined in the second locking arm 24, for lockably receiving the barbs 34 of the longitudinal portion 31. Two hooks 38, 46 are respectively formed at free ends of the first and second locking arms 32, 24.

The post 26 comprises a main shaft 49, a head 48 at a top of the main shaft 49, and a pressing end (not labeled) at a bottom of the main shaft 49 for pressing the base 12 of the heat sink 10. Preferably, the pressing end of the post 26 is enclosed with a cap 28 in order to provide an enlarged pressing area. An outer diameter of the cap 28 is greater than a diameter of the main shaft 49 of the post 26, and is also greater than a diameter of the spring 27. A diameter of the through aperture 36 of the longitudinal portion 31 is slightly greater than that of the main shaft 49 of the post 26, and less than that of the spring 27.

Referring back to FIG. 1, in assembly the heat sink clip 20, the post 26 is extended downwardly through the through aperture 36 of the longitudinal portion 31. The spring 27 is disposed around the post 26 below the longitudinal portion 31. The cap 28 is inferentially engaged with the pressing end of the post 26, so that the spring 27 is held between the cap 28 and the longitudinal portion 31. The barbs 34 are lockingly engaged in the hole 45 of the second locking arm 24.

Figure 3:
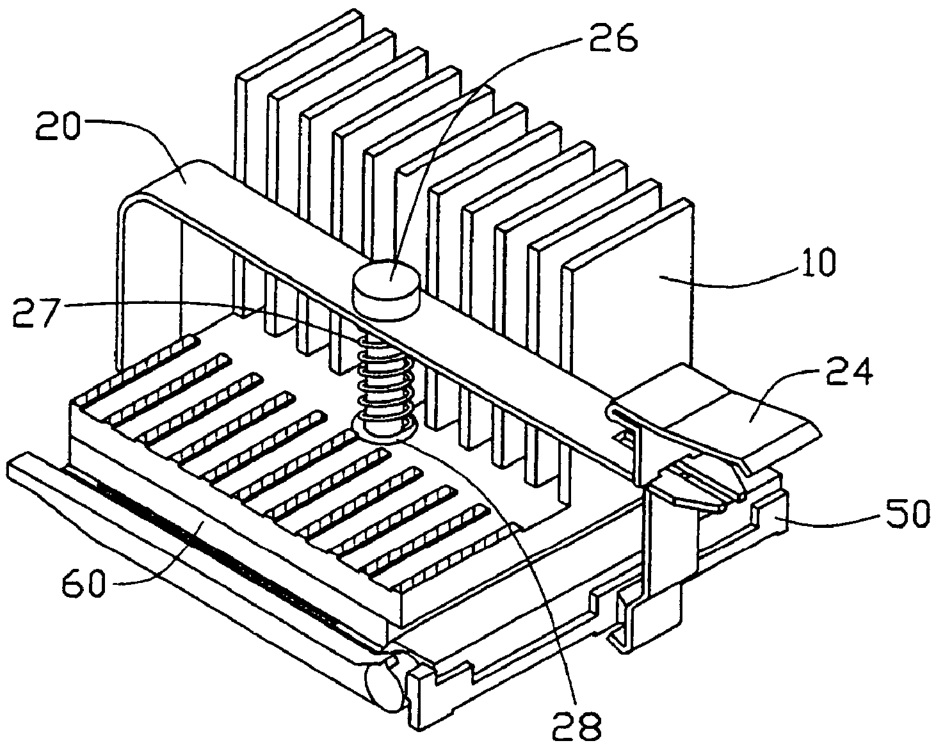
FIG. 3 is an assembled view of FIG. 1, with another part of the heat sink cut away.

Referring also to FIG. 3, in use of the hear sink clip 20, the heat sink 10 is placed on the CPU 60 that is mounted on the socket 50. The heat sink clip 20 is placed in the channel of the heat sink 10. The cap 28 is fittingly received in the blind hole 16 of the base 12 of the heat sink 10. The hooks 38, 46 of the first and second locking arms 32, 24 are resiliently engaged with undersides of the catches 52 of the socket 50 respectively. The spring 27 is thereby compressed, and urges the longitudinal portion 31 upwardly while simultaneously urging the cap 28 downwardly to press the heat sink 10 against the CPU 60. The heat sink 10 is thereby securely attached to the CPU 60.

In disassembly of the heat sink clip 20 from the socket 50, the handle 42 is pressed downwardly so that the hook 46 disengages from the corresponding catch 52 of the socket 50. The clip 20 is then easily taken out from the heat sink 10.

Figure 4:
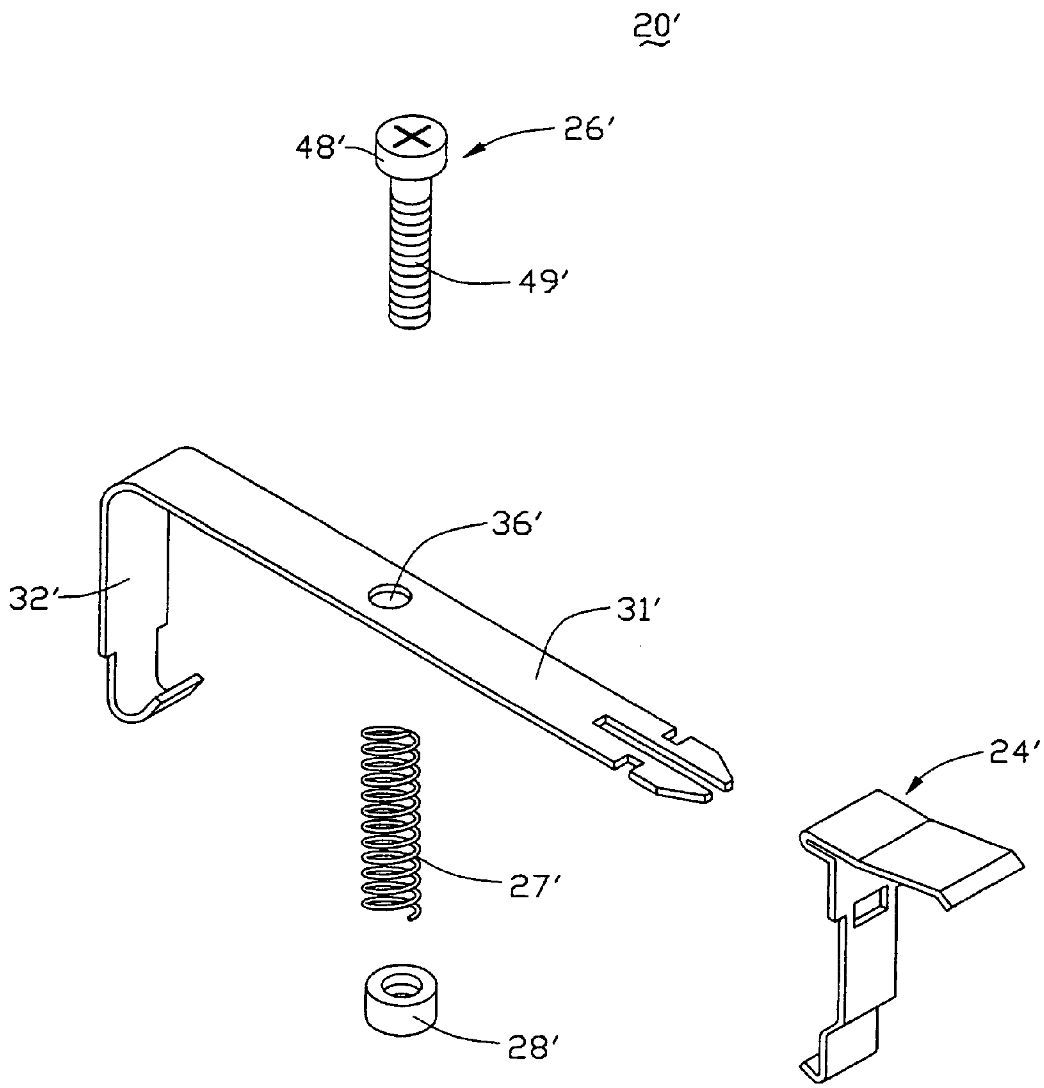
FIG. 4 is an exploded, isometric view of a heat sink clip in accordance with an alternative embodiment of the present invention.

Referring to FIG. 4, a heat sink clip 20' in accordance with the alternative embodiment of the present invention comprises a main body (not labeled), a post 26', and a spring 27'. The main body comprises a longitudinal portion 31', and a first locking arm 32' and a second locking arm 24'. The first locking arm 32' integrally extends downwardly from a first end of the longitudinal portion 31'. The second locking arm 24' is detachably fixed to and extends downwardly from an opposite second end of the longitudinal portion 31'. A through aperture 36' is defined in a middle of the longitudinal portion 31'. The post 26' comprises a main shaft 49', a head 48' at a top of the main shaft 49', and a pressing end (not labeled) at a bottom of the main shaft 49'. A thread (not labeled) is formed on a circumferential periphery of the pressing end. In assembly, the pressing end of the post 26' is threadedly engaged with a cap 28' in order to provide an enlarged pressing area. The cap 28' is fittingly received in the blind hole 16 of the heat sink 10 (see FIG. 1).

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A heat sink clip for attaching a heat sink to an electronic package that is mounted on a socket, the heat sink clip comprising:

a main body comprising a longitudinal portion and first and second locking arms extending downwardly from opposite ends of the longitudinal portion, the longitudinal portion defining a through aperture therein, each of the locking arms having engaging means adapted to engage with the socket;

a post extending through the through aperture of the longitudinal portion, the post having a pressing portion at a bottom thereof fittingly received in a mating portion defined in the heat sink; and a resilient element being arranged around the post and between the pressing portion and the longitudinal portion of the main body.

2. The heat sink clip as described in claim 1, wherein the second arm is detachably engaged with a corresponding end of the longitudinal portion.

3. The heat sink clip as described in claim 1, wherein the second arm comprises a handle at an end thereof.

4. The heat sink clip as described in claim 1, wherein a diameter of the pressing portion is greater than a diameter of a main shaft of the post, and is also greater than a diameter of the resilient element.

5. The heat sink clip as described in claim 4, wherein the pressing portion comprises a cap that is inferentially engaged with the main shaft of the post.

6. The heat sink clip as described in claim 4, wherein the pressing portion comprises a cap that is threadedly engaged with the main shaft of the post.

7. The heat sink clip as described in claim 1, wherein a diameter of the through aperture is slightly greater than a diameter of the main shaft of the post, and less than a diameter of the resilient element.

8. The heat sink clip as described in claim 1, wherein the post comprises a heat at a top thereof.

9. The heat sink clip as described in claim 1, wherein the resilient element is a spring.

10. A heat sink assembly comprising:

a heat sink having a mating portion defined therein;

a support module having first engaging means; and a clip adapted to attach the heat sink onto an electronic package, the clip comprising a main body, a post, and a resilient element, the main body comprising a longitudinal portion, first and second locking arms extending downwardly from opposite ends of the longitudinal portion, the longitudinal portion defining a through aperture, each of the locking arms defining second engaging means to engage with the first engaging means of the support module, the post extending through the through aperture of the longitudinal portion and having a pressing portion at a bottom thereof fittingly received in the mating portion of the heat sink, wherein the resilient element is disposed around the post below the longitudinal portion.

11. The heat sink assembly as described in claim 10, wherein a diameter of the pressing portion is greater than a diameter of a main shaft of the post, and is also greater than a diameter of the resilient element.

12. The heat sink assembly as described in claim 10, wherein the resilient element abuts against the pressing portion.

13. The heat sink assembly as described in claim 10, wherein the first and second engaging means respectively comprises catches and hooks.

14. The heat sink assembly as described in claim 10, wherein the resilient element is a spring.

15. The heat sink assembly as described in claim 10, wherein the post comprises a head at a top thereof.

16. The heat sink assembly as described in claim 11, wherein the pressing portion comprises a cap that is inferentially engaged with the main shaft of the post.

17. The heat sink assembly as described in claim 11, wherein the pressing portion comprises a cap that is threadedly engaged with the main shaft of the post.

18. A heat sink assembly comprising:

a heat sink defining an elongated slot;

a heat generating device on which the heat sink is seated;

an electrical device located under the heat generating device with locking devices thereon;

a clip including a longitudinal portion located in the slot, with two opposite locking arms respectively located at two opposite ends thereof and latchably engaged with the corresponding locking devices, respectively;

a post located on a middle portion of the longitudinal portion and vertically moveable relative thereto; and a compressed coil spring surrounding said post with an upper end upwardly abutting against the middle portion and a lower end downwardly abutting against a lower end of the post;

wherein the lower end of the post imposes forces upon the heat sink due to compression of said coil spring;

wherein said lower end of the post is located in a hole of the heat sink under said slot.

19. The heat sink clip as described in claim 1, wherein the mating portion of the heat sink is a blind hole.

20. The heat sink assembly as described in claim 10, wherein the mating portion of the heat sink is a blind hole.

* * * * *